United States Patent
Choi et al.

(10) Patent No.: US 7,510,747 B2
(45) Date of Patent: Mar. 31, 2009

(54) LENS COMPOSITION OF LIGHT EMISSION DIODE DEVICE, LED DEVICE, BACKLIGHT UNIT AND LIQUID CRYSTAL DISPLAY COMPRISING THE SAME

(75) Inventors: Jin-sung Choi, Cheonan-si (KR); Jheen-hyeok Park, Seongnam-si (KR); Sang-hoon Lee, Yongin-si (KR); Si-joon Song, Yongin-si (KR); Eun-jeong Kang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 357 days.

(21) Appl. No.: 11/335,404

(22) Filed: Jan. 19, 2006

(65) Prior Publication Data

US 2006/0188665 A1    Aug. 24, 2006

(30) Foreign Application Priority Data

Jan. 19, 2005    (KR) .................. 10-2005-0005047

(51) Int. Cl.
    *G02B 1/04* (2006.01)
(52) U.S. Cl. ......................... 428/1.1; 257/98
(58) Field of Classification Search ................ 428/1.1; 257/98, 100; 313/110–117, 512
    See application file for complete search history.

(56) References Cited

U.S. PATENT DOCUMENTS

| | | | | |
|---|---|---|---|---|
| 5,175,783 | A * | 12/1992 | Tatoh .......................... | 385/93 |
| 5,578,156 | A * | 11/1996 | Kamakura et al. ........ | 156/275.5 |
| 6,310,160 | B1 * | 10/2001 | Kodemura ................ | 526/281 |
| 6,404,131 | B1 * | 6/2002 | Kawano et al. ............ | 315/82 |
| 6,883,938 | B1 * | 4/2005 | Kohara et al. ............. | 362/296 |
| 6,961,190 | B1 * | 11/2005 | Tamaoki et al. ........... | 359/726 |
| 2003/0149148 | A1 * | 8/2003 | Hammond et al. ......... | 524/284 |

FOREIGN PATENT DOCUMENTS

| | | |
|---|---|---|
| JP | 10-45977 | 2/1998 |
| JP | 2002-146133 | 5/2002 |
| KR | 2001-0054851 | 7/2001 |
| KR | 10-0334387 | 4/2002 |
| KR | 2003-0057948 | 7/2003 |

* cited by examiner

*Primary Examiner*—Keith D Hendricks
*Assistant Examiner*—Sophie Hon
(74) *Attorney, Agent, or Firm*—Cantor Colburn LLP

(57) ABSTRACT

Provided herein is a lens composition of an LED device for an LCD having high transparency and high heat resistance, and an LED device, a backlight unit and an LCD comprising the lens composition. The lens composition includes a copolymer represented by the formula 1 and having a weight average molecular weight of about 5,000 to about 500,000:

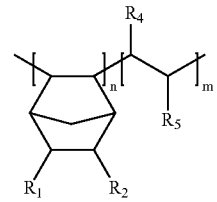

wherein $R_1$ and $R_2$ independently represent a hydrogen atom, a linear, branched or cyclic alkyl group having 1 to 10 carbon atoms or —$COOR_3$ group in which $R_3$ represents a linear, branched or cyclic alkyl group having 1 to 10 carbon atoms, $R_4$ and $R_5$ independently represent a hydrogen atom or an alkyl group having 1 to 10 carbon atoms, the ratio n/n+m ranges from about 0.3 to about 0.995, and the ratio m/n+m ranges from about 0.005 to about 0.7.

13 Claims, 2 Drawing Sheets

LENS COMPOSITION OF LIGHT EMISSION DIODE DEVICE, LED DEVICE, BACKLIGHT UNIT AND LIQUID CRYSTAL DISPLAY COMPRISING THE SAME

This application claims priority to Korean Patent Application No. 10-2005-0005047 filed on Jan. 19, 2005 in the Korean Intellectual Property Office, the disclosure of which is incorporated herein by reference in its entirety.

BACKGROUND OF THE INVENTION

1. Field of the Invention

The present invention relates to a lens composition for a light emission diode (LED) device, an LED device, a backlight unit, and a liquid crystal display (LCD) comprising the same, and more particularly, to a lens composition for an LED device, for an LCD having high transparency and high heat resistance, an LED device, a backlight unit, and an LCD comprising the same.

2. Description of the Related Art

In general, a liquid crystal display (LCD) is an image display device in which liquid crystal is injected into a space between two glass plates and power is applied to upper and lower electrodes installed at the two glass plates to thus vary the molecular arrangement of the liquid crystal at each pixel location. Such an LCD device largely includes a panel unit, a driving unit, and a backlight unit.

Unlike a cathode ray tube (CRT) or a plasma display panel (PDP), the LCD is not a self-luminescent display so that a display of the LCD cannot be achieved in dimly lit environments. To address this problem, that is, in order to operate an LCD device as a display device in a dark place, a backlight unit is utilized to provide uniform illumination onto an information display panel.

In particular, as the trend towards large-sized LCD devices grows, the use of a direct-type backlight unit, which generally provides a high luminance, will increase.

In a direct-type backlight unit, in which a light source is positioned below an LCD panel, a light guide plate (LGP) is disposed in front of the light source and a reflection plate is disposed behind the light source so that light emitted from the light source is diffused and reflected to then illuminate the LCD panel. Since the direct-type backlight unit efficiently utilizes light because of the presence of the reflection plate and the light guide plate, it can be effectively used in a backlight unit requiring high luminance.

As direct type backlight units are becoming increasingly smaller, thinner, and lightweight, a light emitting diode (LED) has been proposed to replace a cold cathode fluorescent lamp (CCFL) that is normally used. This is advantageous from the standpoint of superior luminance, lower power consumption and lower weight over devices that employ CCFL.

However, in the conventional backlight unit, multiple LED devices are arranged to achieve high luminance, resulting in an increase in the internal temperature of the backlight unit. That is, a temperature rise in the backlight unit using LED devices is approximately 1.5 times that of the backlight unit using CCFL as a light source.

Particularly, epoxy resin, which is a material used for a lens of the conventional LED device, is prone to deterioration due to such a large temperature rise. Accordingly, it is desirable to develop compositions suitable for the lens of an LED device in light of the trend toward increasingly larger-sized LCD devices.

SUMMARY OF THE INVENTION

The present invention provides a lens composition for an LED device that can be used in an LCD, which has high transparency and high heat resistance.

The present invention also provides an LED device for an LCD comprising the lens composition.

The present invention also provides a backlight unit for an LCD comprising the lens composition.

The present invention also provides an LCD comprising the lens composition.

The above stated objects as well as other objects, features and advantages, of the present invention will become clear to those skilled in the art upon review of the following description, the attached drawings and appended claims.

According to an aspect of the present invention, there is provided a lens composition comprising a copolymer represented by the formula 1 and having a weight average molecular weight of 5,000 to 500,000:

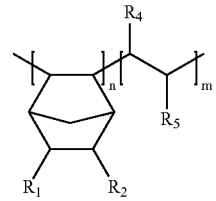

wherein $R_1$ and $R_2$ independently represent a hydrogen atom, a linear, branched or cyclic alkyl group having 1 to 10 carbon atoms or a —$COOR_3$ group in which $R_3$ represents a linear, branched or cyclic alkyl group having 1 to 10 carbon atoms, $R_4$ and $R_5$ independently represent a hydrogen atom or an alkyl group having 1 to 10 carbon atoms, the ratio $n/n+m$ ranges from about 0.3 to about 0.995, and the ratio $m/n+m$ ranges from about 0.005 to about 0.7.

According to another aspect of the present invention, there is provided a light emitting diode (LED) device for an LCD comprising lead frames comprising a cathode and an anode, respectively, a chip positioned on the cathode lead frame, a metal wiring connecting the chip and the anode lead frame, and a lens surrounding the chip, having one end of either lead frame exposed outside, and comprising the lens composition.

According to still another aspect of the present invention, there is provided a backlight unit for an LCD comprising a light source comprising an LED device having lead frames composed of a cathode and an anode, respectively, a chip positioned on the cathode lead frame, a metal wiring connecting the chip and the anode lead frame, and a lens surrounding the chip, having one end of either lead frame exposed outside, and comprising the lens composition, a light guide plate positioned above the light source, and a reflection plate disposed between the light guide plate and the light source and exposing the LED device.

According to yet another aspect of the present invention, there is provided a liquid crystal display (LCD) comprising a panel unit, a driving unit, and the backlight unit.

BRIEF DESCRIPTION OF THE DRAWINGS

The above and other features and advantages of the present invention will become more apparent by the detailed description of exemplary embodiments with reference to the attached drawings in which.

DETAILED DESCRIPTION OF THE INVENTION

Figure 1:
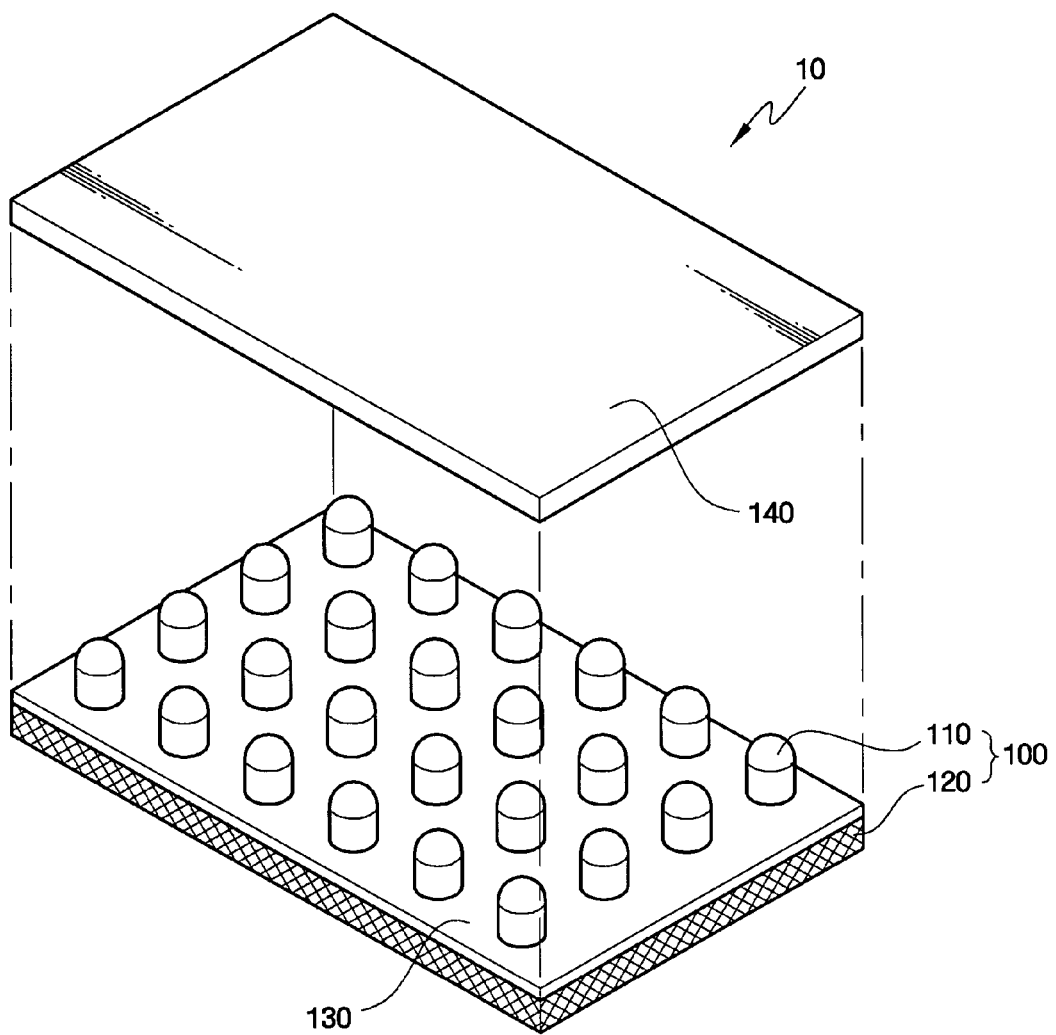
FIG. 1 is a schematic diagram of a backlight unit of an LCD device according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

An LCD device generally includes a panel unit, a driving unit, and a backlight unit. A backlight unit of an LCD device according to an embodiment of the present invention will now be described with reference to FIGS. 1 and 2.

Figure 2:
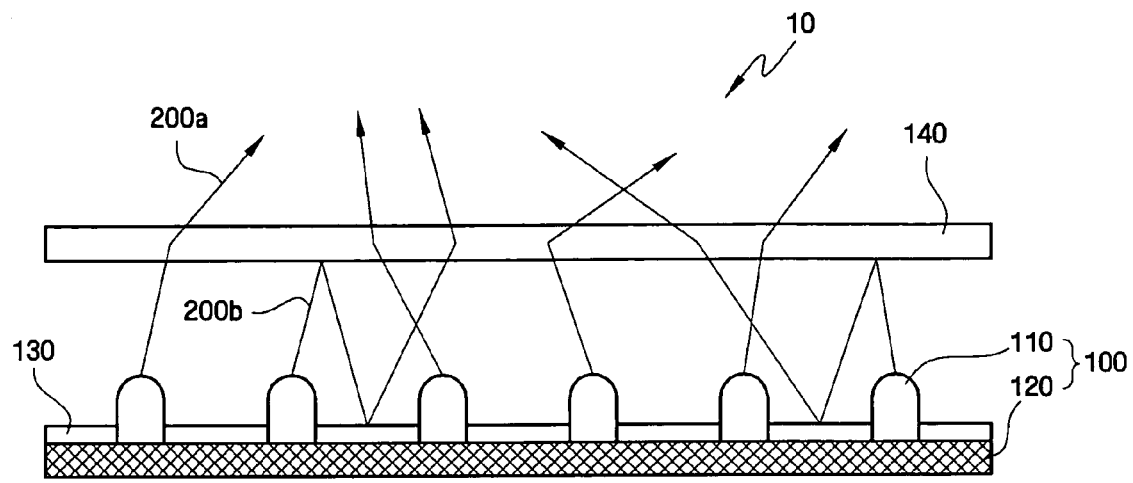
FIG. 2 is a cross-sectional view illustrating a configuration of the backlight unit shown in FIG. 1.

FIG. 1 is a schematic diagram of a backlight unit of an LCD according to an embodiment of the present invention, that comprises LEDs as light sources, and FIG. 2 is a cross-sectional view illustrating a configuration of the backlight unit shown in FIG. 1.

Referring to FIGS. 1 and 2, a backlight unit 10 includes a light source 100 having a plurality of LED devices 110 for irradiating light, a light guide plate 140 positioned above the light source 100, and a reflection plate 130 disposed between the light guide plate 140 and the light source 100 to expose the LED devices 110.

The light source 100 is formed by mounting the plurality of LED devices 110 on a printed circuit board (PCB) 120.

The LED devices 110 may include red-, green- and blue-light emitting LED devices or monochromic, i.e., white-light emitting, LED devices. However, in order to realize accurate colors in actual applications for LCDs, it is advantageous to use white light obtained by mixing red-, green- and blue-light emitted from the corresponding LED devices 110, respectively.

The PCB 120 having the LED devices 110 mounted thereon includes a circuit for controlling the LED devices 110, and an electrode unit (not shown) for transmitting a control signal supplied from the circuit to the LED devices 110. The electrode unit may be projecting on a surface of a predetermined region of the PCB 120 and supporting the LED devices 110. In such a manner, the PCB 120 controls emission of the LED devices 110 using the controller and the electrode unit.

The reflection plate 130 is formed on a surface of the PCB 120 other than the region corresponding to the LED devices 110 and reflects back light that is reflected toward the PCB 120 instead of being transmitted through the light guide plate 140. That is, as shown in FIG. 2, some of the light emitted from the light source 100 is transmitted through the light guide plate 140. This light, which is referred to as first light 200a, in FIG. 2, travels toward a liquid crystal layer (not shown). Some of the light emitted from the light source 100 is not transmitted through the light guide plate 140 and this light, which is referred to as second light 200b, is reflected by the reflection plate 130 to travel toward the light guide plate 140.

In order to uniformly distribute incident light reflected from the reflection plate 130, the light guide plate 140 is installed on and spaced a predetermined distance apart from the light source 100. The light guide plate 140 is formed of a transparent resin such as an acryl resin, a polyurethane resin, a silicone resin, or a combination comprising at least one of the foregoing. In addition, in order to maintain uniform brightness over the LCD panel, and hence, to avoid showing the LED device 110 outside due to strong intensity of light emitted from the LED devices 110, screen printed patterns (not shown) may be formed only on a region of the light guide plate 140 where the LED devices 110 of the light source 100 are installed.

The LED devices 110 included in the backlight unit 10 of the aforementioned LCD according to the present invention will now be described in more detail.

Figure 3:
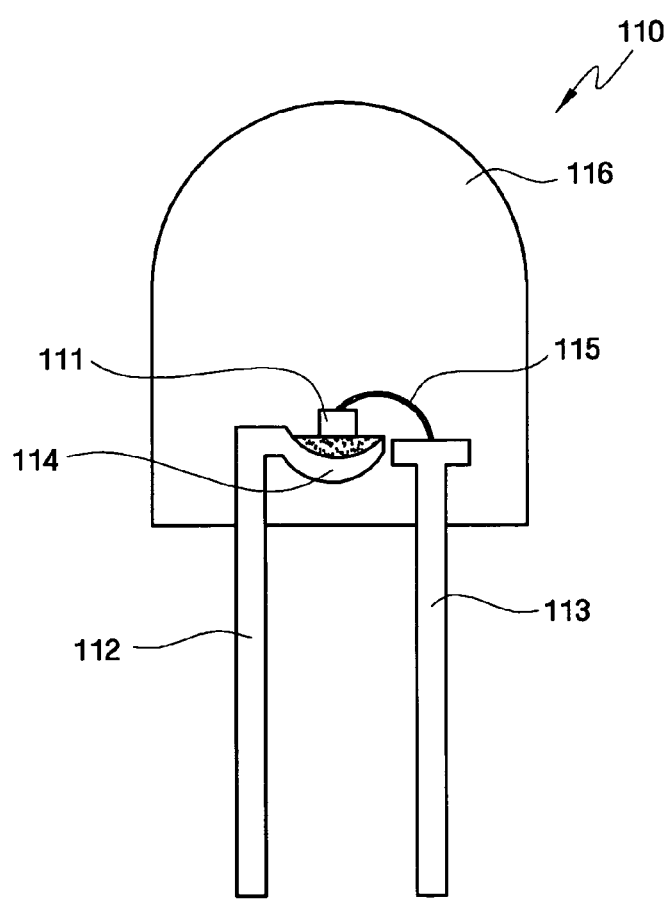
FIG. 3 is a schematic diagram illustrating a configuration of an LED device shown in FIG. 1.

FIG. 3 is a schematic diagram illustrating a configuration of an LED device shown in FIG. 1.

As shown in FIG. 3, an LED device 110 includes a chip 111 that emits light when a voltage is applied thereto, and lead frames 112 and 113 made of a conductive metal and composed of a cathode and an anode for applying the voltage to the chip 111. The chip 111 is attached to a pad 114 formed at one end of the cathode lead frame 112 of the cathode by a conductive adhesive agent and is connected to one end of the anode lead frame 113 via a metal wire 115. The chip 111 is thus electrically connected between the cathode and anode lead frames 112 and 113. The chip 111 is molded in a lens 116 designed to protect the chip 111 from any external impact. The lens 116 also promotes light mixing by reflecting light emitted from the chip 111 at a critical angle, while allowing the other ends of the cathode and anode lead frames 112 and 113 to be partially exposed to the outside. This configuration allows an external voltage to be applied to the chip 111.

To enable the lens 116 of the LED device 110 to promote light mixing by reflecting the light emitted from the chip 111 at a critical angle, the lens 116 should comprise a composition capable of maintaining transparency without any deformation in the shape of the lens 116 at high temperatures.

An exemplary lens composition for the LED devices 110 having high heat resistance and high transparency is a copolymer represented by the formula 1:

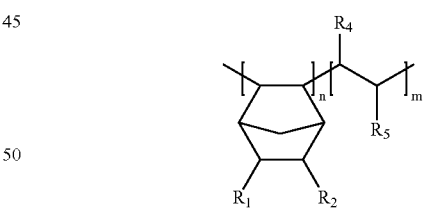

wherein $R_1$ and $R_2$ independently represent a hydrogen atom, a linear, branched or cyclic alkyl group having 1 to 10 carbon atoms or —$COOR_3$ group in which $R_3$ represents a linear, branched or cyclic alkyl group having 1 to 10 carbon atoms, $R_4$ and $R_5$ independently represent a hydrogen atom or an alkyl group having 1 to 10 carbon atoms, the ratio $n/n+m$ ranges from about 0.3 to about 0.995, and the ratio $m/n+m$ ranges from about 0.005 to about 0.7.

The copolymer is generally composed of norbornene-based monomers and ethylene-based monomers.

Illustrative, but not limiting examples of norbornene-based monomers which may be used in the preparation of the copolymer may be selected from 2-norbornene, 5-methyl-2- norbornene, 5-ethyl-2-norbornene, 5-butyl-2-norbornene, 5-propyl-2-norbornene, 5-phenyl-2-norbornene, 5-hexyl-2-norbornene, 5-octyl-2-norbornene, 5-nonyl-2-norbornene, 5-decyl-2-norbornene, 5-pentyl-2-norbornene, 5-methoxycarbonyl-2-norbornene, 5-ethoxycarbonyl-2-norbornene, 5-t-butoxycarbonyl-2-norbornene, 5-methyl-5-methoxycarbonyl-2-norbornene, or a combination comprising at least one of the foregoing norbornene-based monomers.

In addition, illustrative, but not limiting examples of the ethylene-based monomers, which may be used in the preparation of the copolymer may be selected from ethylene, propylene, 1-butene, 1-hexene, 1-heptene, 1-octene, 1-nornene, 1-decene, 1-dodecene, or a combination comprising at least one of the foregoing ethylene-based monomers. An exemplary monomer is ethylene.

The lens composition of the LED devices 110 according to the present invention may include about 30 to about 99.5 wt %, preferably about 30 to about 70 wt %, of the norbornene-based monomer, based on the total weight of the copolymer. In addition, the lens composition of the LED devices 110 according to the present invention may include about 0.5 to about 70 wt %, preferably about 30 to about 70 wt %, of the ethylene-based monomer, based on the total weight of the copolymer. If the content of the ethylene-based monomer is lower than the range stated above, the glass transition temperature is increased to a point that results in poor formability. If the content of the ethylene-based monomer is greater than the range stated above, the glass transition temperature is so low that heat resistance is reduced.

The lens composition of the LED devices 110 according to the present invention has a weight average molecular weight ranging from about 5,000 to about 500,000, as measured by gel permeation chromatography using a toluene solution maintained at 35° C. If the weight average molecular weight of the lens composition is too small, satisfactorily sufficient impact strength cannot be achieved. If the weight average molecular weight of the lens composition is greater than the upper limit stated above, the viscosity of the lens composition is undesirably increased, resulting in poor formability.

In addition, the lens composition of the LED devices 110 according to the present invention preferably has a melt index of about 5 to about 60 grams/10 min, as measured by JIS-K-6719 at 280° C. under a load of 2.16 kgf.

The lens composition of the LED devices 110 according to the present invention may have a glass transition temperature ranging from about 90 to about 180° C., preferably about 100 to about 150° C. The glass transition temperature of the composition is associated with meltability. If the glass transition temperature is greater than the upper limit, internal stress may remain in the composition and birefringence may be highly probable. If the glass transition temperature is lower than the lower limit, the heat resistance of the lens may be undesirably lowered.

Further, the lens composition of the LED devices 110 according to the present invention has light transmittance of about 91% or greater over the wavelengths between 300 and 800 nm. The transparency of the composition is improved because there is no double bond present in the lens composition, which causes yellowing due to oxidation in the presence of UV light and/or oxygen.

A method for preparing the lens composition of the LED devices 110 according to the present invention will now be described.

To prepare the lens composition of the LED devices 10 according to the present invention, a norbornene-based monomer and an ethylene-based monomer are copolymerized. Here, the norbornene-based monomer may be used in an amount of about 30 to about 99.5 wt % and the ethylene-based monomer may be used in an amount of about 0.5 to about 70 wt %.

During the copolymerization of the norbornene-based monomer and the ethylene-based monomer, at least one catalyst selected from a transition metal, a transition metal compound, an organometallic compound, a protonic acid, or a combination comprising at least one of the foregoing catalysts may be used.

The transition metal used as the catalyst may be metals selected from Group IVb through Group VIII of the Periodic Table of Elements, and illustrative examples thereof include titanium, zirconium, vanadium, iron, cobalt, tungsten, nickel, palladium, or a combination comprising at least one of the foregoing metals.

The transition metal compound used as the catalyst may be selected from the group consisting of a zirconium compound exemplified by bis(cyclopentadienyl)titanium dichloride, titanium(III) chloride, titanium(IV) chloride, titanium(IV) bromide, bis(cyclopentadienyl)dimethyltitanium, (cyclopentadienyl)titanium trichloride, bis(cyclopentadienyl)zirconium dichloride, zirconium(III) chloride, zirconium(IV) chloride, zirconium(IV) bromide, bis(cyclopentadienyl)dimethylzirconium, (cyclopentadienyl)zirconium trichloride, and dichlorozirconiumbis(acetylacetonate); a vanadium compound exemplified by bis(cyclopentadienyl)vanadium dichloride, vanadium(III) chloride, vanadium(IV) chloride, vanadium(IV) bromide, bis(cyclopentadienyl)dimethylvanadium, (cyclopentadienyl)vanadium trichloride, and dichlorovanadiumbis(acetylcetonate); an iron compound exemplified by ferric chloride, ferric acetate, iron(III) acetylacetonate, and ferrocene; a cobalt compound exemplified by cobalt acetate, cobalt(II) acetylacetonate, cobalt(III) acetylacetonate, cobalt chloride, and cobalt stearate; a tungsten compound exemplified by tungsten hexachloride; a nickel compound exemplified by nickellocene, nickel acetate, nickel chloride, nickelbisacetylacetonate, tetrakis(triphenylphosphine)nickel, dicarbonylbis(triphenylphosphine)nickel, bis (allyl)nickel, allylnickel chloride, and chloro(phenyl)bis (triphenylphosphine)nickel; and a palladium compound exemplified by palladium(II) acetate, palladiumbisacetylacetonate, palladium bromide, palladium chloride, palladium iodide, palladium oxide, carbonyl tris(triphenylphosphine) palladium, dichlorobis(acetonitrile)palladium, dichlorobis (benzonitrile)palladium, dichlorobis(triphenylphosphine) palladium, or a combination comprising at least one of the foregoing transition metal compound catalysts.

The organometallic compounds used as the catalyst can be selected from Group I through Group IV of the Periodic Table of Elements. Specific examples of the organometallic compound include organic compounds exemplified by trimethyl aluminum, triethyl aluminum, triethyl aluminum, tri n-propyl aluminum, diethyl aluminum monochloride, propyl aluminum monochloride, diisobutyl aluminum monochloride, methyl aluminum sesquichloride, ethyl aluminum sesquibromide, aluminum sesquichloride, and ethyl aluminum dichloride; and organic tin compounds exemplified by tin dichloride, and tin tetrachloride, or a combination comprising at least one of the foregoing organometallic catalysts.

In addition, a catalyst system with components for enhancing polymerization activity may be used. Usable examples of a polymerization catalyst system include living cationic catalysts exemplified by titanium tetrachloride, 2-methoxy 2-phenylpropane, 1,4-bis(2-methoxy 2-propyl)benzene, or a combination comprising at least at least one of the foregoing catalysts for enhancing polymerization.

The catalyst used for copolymerization can be used in an amount of about 0.01 to about 20 mmol/l, preferably about 0.1 to about 10 mmol/l, based on the total amount of the norbornene-based monomer and the ethylene-based monomer.

The copolymerization of the norbornene-based monomer and the ethylene-based monomer can be performed without a solvent but may be generally performed with an inactive organic solvent. Examples of the useful organic solvents include an aromatic solvent such as benzene, toluene or xylene, a hydrocarbon solvent such as pentane, hexane, heptane, octane, cyclopentane, cyclohexane, methylcyclohexane or decane, a halogenated hydrocarbon solvent such as methyl chloride, methylene chloride, 1,2-dichloroethane, 1,1,1-trichloroethane, 1,1,2-trichloroethane or 1,1,2-trichloroethylene, a polar solvent such as nitromethane, and combinations of at least two kinds of solvents.

The solvent used for copolymerization can be used in an amount of about 1 to about 10 times, preferably about 1 to about 5 times, the total amount of the norbornene-based monomer and the ethylene-based monomer.

The copolymerization of the norbornene-based monomer and the ethylene-based monomer may be performed at a temperature in the range of about −20 to about 150° C., preferably about 20 to about 100° C. Under the nitrogen condition, the pressure may range from about 0.01 to about 50 psig, preferably about 1 to about 10 psig. The other polymerization conditions, e.g., a polymerization time, may be varied to yield desired polymers in consideration of the degree of polymerization or proportion of repeating units.

Methods for recovery of the copolymer are not particularly limited. In one embodiment, a polymerized solution may be poured into a large amount of non-solvent, e.g., alcohol, to then precipitate the copolymer and then the precipitant was recovered by filtering or centrifugation.

The present invention is described in more detail by Examples and Comparative Examples, but the Examples are only illustrative and, therefore, not intended to limit the scope of the present invention.

EXPERIMENTAL EXAMPLE 1

To a reactor equipped with a nitrogen purge line and a pressure injector was introduced 100 wt % of a monomer blend consisting of 70 wt % of norbornene monomer and 30 wt % of ethylene monomer. Approximately 180 wt % of toluene was injected into the reactor from a toluene feed line, followed by stirring while maintaining the temperature at 20° C.

Continuously, a 0.3 mol of a palladium acetate solution dissolved in 60 wt % of toluene was slowly added to the reactor which was then heated to polymerization at a temperature of 100° C. under the nitrogen pressure of 5 psig for 3 hours.

Thereafter, 1 L of methanol was added to the reactor to precipitate the produced copolymer. The precipitated copolymer was separated by filtering and precipitating. Then, the resultant product was washed with 300 wt % of methanol and 40 wt % of concentrated chloric acid, and washed twice more with 150 wt % of methanol, followed by drying at 100° C. under reduced pressure of 1 mmHg for 48 hours, yielding a copolymer.

As measured through H-NMR, only peaks of hydrogen bonded with saturated carbon were observed at 1 to 2.5 ppm, identifying the structure of an addition polymerization type copolymer. The result of the copolymerization is shown in Table 1.

EXPERIMENTAL EXAMPLE 2

A copolymer was prepared in the same manner as described in Experimental Example 1 except that 60 wt % of 5-methoxycarbonyl-2-norbornene was used as a norbornene-based monomer and a proportion of the ethylene monomer was changed to 40 wt %.

As measured through H-NMR, only peaks of hydrogen bonded with saturated carbon were observed at 1 to 2.5 ppm, identifying the structure of an addition polymerization type copolymer. The result of the copolymerization is shown in Table 1.

EXPERIMENTAL EXAMPLE 3

A copolymer was prepared in the same manner as described in Experimental Example 1 except that 70 wt % of 5-hexyl-2-norbornene was used as a norbornene-based monomer.

As measured through H-NM, only peaks of hydrogen bonded with saturated carbon were observed at 1 to 2.5 ppm, identifying the structure of an addition polymerization type copolymer. The result of the copolymerization is shown in Table 1.

COMPARATIVE EXPERIMENTAL EXAMPLE 1

An epoxy resin, which is commonly used as a lens composition of an LED device, was prepared. The result of the copolymerization is shown in Table 1.

TABLE 1

| | Yield (%) | Weight average molecular weight | Glass transition temperature* (° C.) | Melt index** (g/10 min) |
|---|---|---|---|---|
| Experimental Example 1 | 78 | 200,000 | 130 | 20 |
| Experimental Example 2 | 80 | 100,000 | 120 | 20 |
| Experimental Example 3 | 78 | 80,000 | 126 | 40 |
| Comparative Experimental Example 1 | 78 | 80,000 | 90 | 20 |

In Table 1, the glass transition temperature (*) was measured according to JIS-K712. The melt index (**) was measured at 280° C. under a load of 2.16 kgf according to JIS-K6719. The hole diameter of a die was set to 2.095 +/− 0.03 mm and the traveling distance of a piston was set to 25.0 +/− 0.25.

To evaluate heat resistance and transparency of lens compositions of the LED devices accordingly, Experimental Examples 1 through 3 and Comparative Experimental Example 1, based on 100 wt % of each of the respective compositions, 0.2 wt % of pentaerythritol tetrakis(3-(3,5-t-butyl-4-hydroxyphenyl)propionate) as an antiaging agent, and 0.2 wt % of 2,2,6,6-tetramethyl-4-pyperizylbenzoate as a light stabilizer were extruded by a twin-screw extruder and stand-cut to gain pellet-shaped resin. The pellets were injection-molded to prepare lenses having a thickness of 1.2 mm and a diameter of 65 mm. The heat resistance and transparency of each lens were measured and the results are shown in Table 2.

To evaluate heat resistance, the lens was aged at an oven maintained at 100° C. for 24 hours and size variations were measured. Measurement of transparency was carried out by measuring light transmittance (%) using a spectrometer (Model U-30 manufactured by Nippon Spectrum Corporation, Japan) while continuously varying the wavelength in a range of 300 to 800 nm. The minimum light transmittance was determined as the light transmittance of a pertinent lens. Higher light transmittance was determined as having better transparency.

TABLE 2

| | Composition | Content of norbornene-based monomer (wt %) | Light transmittance (%) | Heat resistance |
|---|---|---|---|---|
| Lens 1 | Experimental Example 1 | 70 | 91 | ◉ |
| Lens 2 | Experimental Example 2 | 60 | 91.5 | ◉ |
| Lens 3 | Experimental Example 3 | 70 | 91 | o |
| Lens 4 | Comparative Experimental Example 1 | epoxy resin | 89.9 | Δ |

◉: 0.1% or less in size variation
o: greater than 0.1% and no more than 0.3% in size variation
Δ: greater than 0.3% and no more than 1.0% in size variation
X: greater than 1.0% in size variation As evident from Table 2, the lenses using the compositions prepared in Experimental Examples 1 through 3 have excellent heat resistance and experience no lens deformation at high temperature. In addition, the lenses exhibit good light transmittance. Further, the lenses have good transparency, which is because they do not undergo yellowing since there are no double bonds present in the composition. By contrast, the lens using the composition prepared in Comparative Experimental Example 1, that is, Lens 4 in Table 2, is poor in heat resistance and transparency.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

As described above, according to the present invention, a lens composition of an LED device for an LCD can be achieved, which has high heat resistance and high transparency. Since a lens manufactured using the lens composition maintains transparency even by heat generated from the LED device without deforming the shape of the lens, it can be advantageously used for large-sized LCDs.

What is claimed is:

1. A light emitting diode (LED) device for an LCD comprising:
   lead frames composed of a cathode and an anode, respectively;
   a chip positioned on the cathode lead frame;
   a metal wire connecting the chip and the anode lead frame; and
   a lens comprising a lens composition comprising a copolymer represented by the formula 1 and having a weight average molecular weight of about 5,000 to about 500,000:

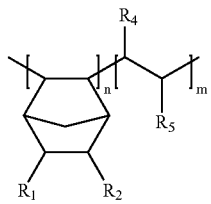

wherein $R_1$ and $R_2$ independently represent a hydrogen atom, a linear, branched or cyclic alkyl group having 1 to 10 carbon atoms or —$COOR_3$ group in which $R_3$ represents a linear, branched or cyclic alkyl group having 1 to 10 carbon atoms, $R_4$ and $R_5$ independently represent a hydrogen atom or an alkyl group having 1 to 10 carbon atoms, the ratio n/n+m ranges from about 0.3 to about 0.995, and the ratio m/n+m ranges from about 0.005 to about 0.7, wherein the lens surrounds the chip, having one end of either lead frame exposed outside, and the lens contacts the chip.

2. The LED device of claim 1, wherein the copolymer is polymerized from monomers selected from the group consisting of 2-norbornene, 5-methyl-2-norbornene, 5-ethyl-2-norbornene, 5-butyl-2-norbornene, 5-propyl-2-norbornene, 5-phenyl-2-norbornene, 5-hexyl-2-norbornene, 5-octyl-2-norbornene, 5-nonyl-2-norbornene, 5-decyl-2-norbornene, 5-pentyl-2-norbornene, 5-methoxycarbonyl-2-norbornene, 5-ethoxycarbonyl-2-norbornene, 5-t-butoxycarbonyl-2-norbornene, 5-methyl-5-methoxycarbonyl-2-norbornene, or a combination comprising at least one of the foregoing monomers.

3. The LED device of claim 1, wherein the copolymer is polymerized from monomers selected from the group consisting of ethylene, propylene, 1-butene, 1-hexene, 1-heptene, 1-octene, 1-nomene, 1-decene, 1-dodecene, or a combination comprising at least one of the foregoing monomers.

4. The LED device of claim 1, wherein the copolymer has a melt index ranging from about 5 to about 60g/10 min.

5. The LED device of claim 1, wherein the copolymer has a glass transition temperature ranging from about 90 to about 180° C.

6. The LED device of claim 1, wherein the copolymer has a transmittance of 91% or greater over the wavelengths between about 300 and about 800 nm.

7. A backlight unit for an LCD comprising:
   a light source comprising an LED device having lead frames composed of a cathode and an anode, respectively, a chip positioned on the cathode lead frame, a metal wire connecting the chip and the anode lead frame, and a lens surrounding the chip, having one end of either lead frame exposed outside, and comprising a lens composition comprising a copolymer represented by the formula 1 and having a weight average molecular weight of about 5,000 to about 500,000:

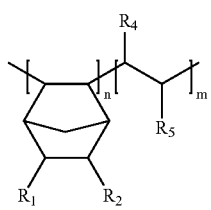

wherein $R_1$ and $R_2$ independently represent a hydrogen atom, a linear, branched or cyclic alkyl group having 1 to 10 carbon atoms or —$COOR_3$ group in which $R_3$ represents a linear, branched or cyclic alkyl group having 1 to 10 carbon atoms, $R_4$ and $R_5$ independently represent a hydrogen atom or an alkyl group having 1 to 10 carbon atoms, the ratio n/n+m ranges from about 0.3 to about 0.995, and the ratio m/n+m ranges from about 0.005 to about 0.7;

a light guide plate positioned above the light source; and a reflection plate disposed between the light guide plate and the light source and exposing the LED device.

8. The backlight unit of claim 7, wherein the copolymer is polymerized from monomers selected from the group consisting of 2-norbornene, 5-methyl-2-norbornene, 5-ethyl-2-norbornene, 5-butyl-2-norbornene, 5-propyl-2-norbornene, 5-phenyl-2-norbornene, 5-hexyl-2-norbornene, 5-octyl-2-norbornene, 5-nonyl-2-norbornene, 5-decyl-2-norbornene, 5-pentyl-2-norbornene, 5-methoxycarbonyl-2-norbornene, 5-ethoxycarbonyl-2-norbornene, 5-t-butoxycarbonyl-2-norbornene, 5-methyl-5-methoxycarbonyl-2-norbornene, or a combination comprising at least one of the foregoing monomers.

9. The backlight unit of claim 7, wherein the copolymer is polymerized from monomers selected from the group consisting of ethylene, propylene, 1-butene, 1-hexene, 1-heptene, 1-octene, 1-nomene, 1-decene, 1-dodecene, or a combination comprising at least one of the foregoing monomers.

10. The backlight unit of claim 7, wherein the copolymer has a melt index ranging from about 5 to about 60g/10 min.

11. The backlight unit of claim 7, wherein the copolymer has a glass transition temperature ranging from about 90 to about 180° C.

12. The backlight unit of claim 7, wherein the copolymer has a transmittance of about 91% or greater over the wavelengths between about 300 and about 800 nm.

13. A liquid crystal display (LCD) comprising:

a panel unit;

a driving unit; and the backlight unit according to claim 7.

* * * * *